US009437642B2

(12) United States Patent
Kimura

(10) Patent No.: US 9,437,642 B2
(45) Date of Patent: Sep. 6, 2016

(54) SEMICONDUCTOR DEVICE INCLUDING A SOLID STATE IMAGING DEVICE

(71) Applicant: Renesas Electronics Corporation, Kawasaki-shi, Kanagawa (JP)

(72) Inventor: Masatoshi Kimura, Kanagawa (JP)

(73) Assignee: Renesas Electronics Corporation, Kanawaga (JP)

( * ) Notice: Subject to any disclaimer, the term of this patent is extended or adjusted under 35 U.S.C. 154(b) by 0 days.

(21) Appl. No.: 14/716,125

(22) Filed: May 19, 2015

(65) Prior Publication Data

US 2015/0357365 A1    Dec. 10, 2015

(30) Foreign Application Priority Data

Jun. 5, 2014  (JP) .................................. 2014-116381

(51) Int. Cl.
*H01L 27/146* (2006.01)

(52) U.S. Cl.
CPC ... *H01L 27/14643* (2013.01); *H01L 27/14603* (2013.01); *H01L 27/14612* (2013.01); *H01L 27/14641* (2013.01)

(58) Field of Classification Search
CPC ................................................... H01L 27/146
USPC .................. 257/225, 292; 348/326, 301, 308
See application file for complete search history.

(56) References Cited

U.S. PATENT DOCUMENTS

| 8,319,874 | B2 | 11/2012 | Suzuki |
| 8,773,560 | B2 | 7/2014 | Okita et al. |
| 2008/0273104 | A1* | 11/2008 | Parks et al. .................... 348/294 |
| 2009/0290059 | A1* | 11/2009 | Suzuki .......................... 348/308 |
| 2012/0018787 | A1* | 1/2012 | Iwasawa ....................... 257/292 |
| 2012/0248516 | A1* | 10/2012 | Mayer ........................... 257/292 |
| 2014/0139716 | A1 | 5/2014 | Sasaki et al. |

FOREIGN PATENT DOCUMENTS

| JP | 2008-193527 A | 8/2008 |
| JP | 2013-041890 A | 2/2013 |
| JP | 2013-106194 A | 5/2013 |

* cited by examiner

*Primary Examiner* — Sheng Zhu
(74) *Attorney, Agent, or Firm* — Sughrue Mion, PLLC

(57) ABSTRACT

A semiconductor device is reduced in power consumption, the semiconductor device including a solid-state imaging device that includes pixels each having a plurality of light receiving elements. A pixel having first and second photodiodes is provided with a first transfer transistor that transfers charge in the first photodiode to a floating diffusion capacitance section, and a second transfer transistor that combines charge in the first photodiode and charge in the second photodiode, and transfers the combined charge to the floating diffusion capacitance section. Consequently, the semiconductor device is reduced in power required for activation of each transfer transistor in operation such as imaging with the solid-state imaging device.

9 Claims, 5 Drawing Sheets

_US 9,437,642 B2_

SEMICONDUCTOR DEVICE INCLUDING A SOLID STATE IMAGING DEVICE

CROSS-REFERENCE TO RELATED APPLICATIONS

The disclosure of Japanese Patent Application No. 2014-116381 filed on Jun. 5, 2014 including the specification, drawings and abstract is incorporated herein by reference in its entirety.

BACKGROUND

The present invention relates to a semiconductor device, specifically a technique to be effectively applied to a semiconductor device including a solid-state imaging device.

Autofocus detection should be performed fast and accurately for high-quality video imaging with a digital camera. Recently, there has been developed a digital camera, which employs a solid-state imaging device including a plurality of pixels each having two photoelectric conversion units, and performs autofocus adjustment by an image-plane phase-difference detection method.

Japanese Unexamined Patent Application Publication Nos. 2013-106194, 2008-193527, and 2013-041890 each describe a solid-state imaging device including pixels each having two photodiodes therein. In such solid-state imaging devices, a gate electrode provided between the two photodiodes is not a component of a transfer transistor for reading charge in each photodiode.

SUMMARY

To achieve long video imaging, power is necessarily consumed to process a large amount of data from video images, and corresponding power must be stably supplied. Power consumption of a camera system as a whole should be reduced in order to achieve such stable power supply.

When a plurality of photodiodes as the photoelectric conversion units are provided in a pixel, and when charge acquired through imaging is transferred from each photodiode, a transfer transistor neighboring each photodiode in the pixel is probably turned on. In this case, since each of the transfer transistors corresponding to the photodiodes must be turned on, electric potential is supplied to the gate electrode of each transfer transistor, which disadvantageously increases power consumption for imaging operation.

Other objects and novel features will be clarified from the description of this specification and the accompanying drawings.

Among the embodiments disclosed herein, a typical one example is briefly summarized as follows.

According to an embodiment of the invention, there is provided a semiconductor device that includes a solid-state imaging device including pixels, each pixel including: a first photodiode and a second photodiode; a first transfer transistor that transfers charge in the first photodiode to a floating diffusion capacitance section; and a second transfer transistor that combines charge in the first photodiode and charge in the second photodiode, and transfers the combined charge to the floating diffusion capacitance section.

According to an embodiment of the invention disclosed herein, performance of the semiconductor device can be improved. In particular, the solid-state imaging device can be saved in power.

DETAILED DESCRIPTION

Hereinafter, some embodiments of the invention will be described in detail with reference to the accompanying drawings. In all drawings illustrating the following embodiments, components having the same function are designated by the same numeral, and duplicated description is omitted. In the following embodiments, an equivalent or similar portion is not repeatedly described except for a particularly required case.

First Embodiment

A semiconductor device of a first embodiment is now described with reference to FIGS. 1 to 4. The semiconductor device of the first embodiment relates to a solid-state imaging device, specifically a solid-state imaging device including pixels each having a plurality of photodiodes therein.

Figure 1:
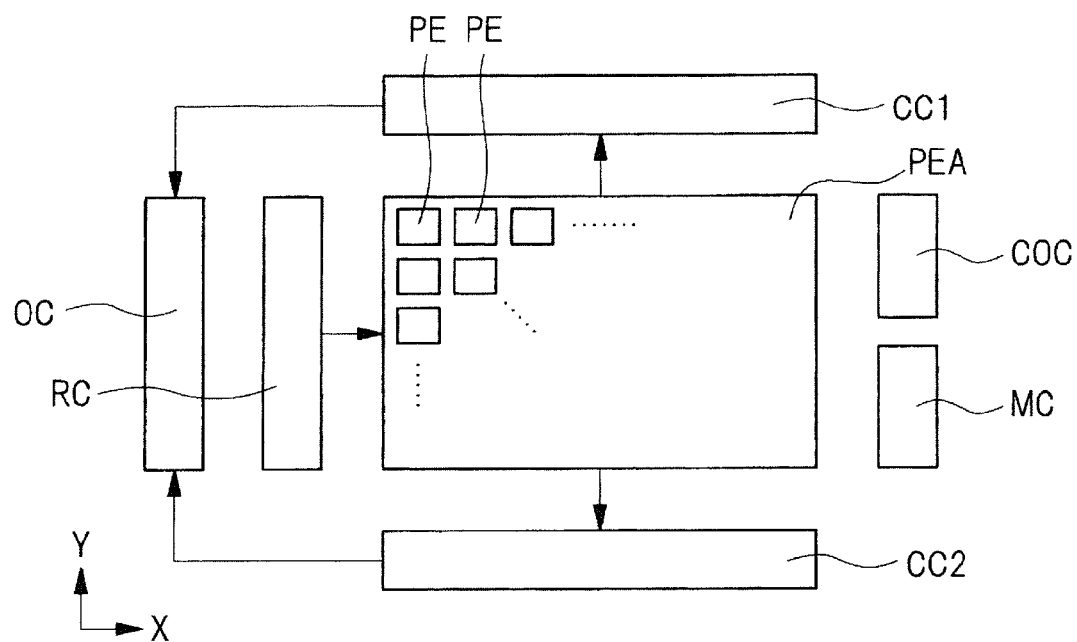
FIG. 1 is a schematic diagram illustrating a configuration of a semiconductor device of a first embodiment of the invention.

FIG. 1 is a schematic diagram illustrating a configuration of a solid-state imaging device of the first embodiment. The solid-state imaging device as a semiconductor device of this embodiment is an image sensor of complementary metal oxide semiconductor (CMOS), which includes, as illustrated in FIG. 1, a pixel allay section PEA, read circuits CC1 and CC2, an output circuit OC, a row selection circuit RC, a control circuit COC, and a memory circuit MC.

The pixel allay section PEA includes a plurality of pixels PE arranged in a matrix. Specifically, the pixels PE are arranged in X- and Y-axis directions on a top of a semiconductor substrate for configuring the solid-state imaging device. The periphery of each pixel PE is surrounded by an element isolating region (element isolating structure). The X-axis direction illustrated in FIG. 1 is along the main surface of the semiconductor substrate for configuring the solid-state imaging device, and also along a row direction in which the pixels PE are arranged. The Y-axis direction is along the main surface of the semiconductor substrate and perpendicular to the X-axis direction, and also along a column direction in which the pixels PE are arranged. In other words, the pixels PE are arranged in a matrix.

Each of the pixels PE generates a signal having a level corresponding to intensity of applied light. The row selection circuit RC selects a plurality of pixels PE in rows. Each of the pixels PE selected by the row selection circuit RC outputs the generated signal to an output line OL (see FIG. 2) described later. The read circuits CC1 and CC2 are arranged to be opposed to each other in the Y-axis direction with the pixel allay section PEA in between. Each of the read circuits CC1 and CC2 reads the signal, which is output from each pixel PE to the output line OL, and sends the signal to the output circuit OC. The memory circuit MC is a storage section that temporarily stores the signal output from the output line OL.

The read circuit CC1 reads signals from half of the pixels PE on a side close to the read circuit CC1, and the read circuit CC2 reads signals from the other half of the pixels PE on a side close to the read circuit CC2. The output circuit OC receives the signals read from the pixels PE by the read circuits CC1 and CC2, and outputs the signals to the outside of the solid-state imaging device. The control circuit COC generally manages overall operation of the solid-state imaging device, and controls operation of any of other components of the solid-state imaging device. The memory circuit MC stores a signal output from one of the two photodiodes in the pixel PE in order to measure magnitude of charge output from each of the two photodiodes.

Figure 2:
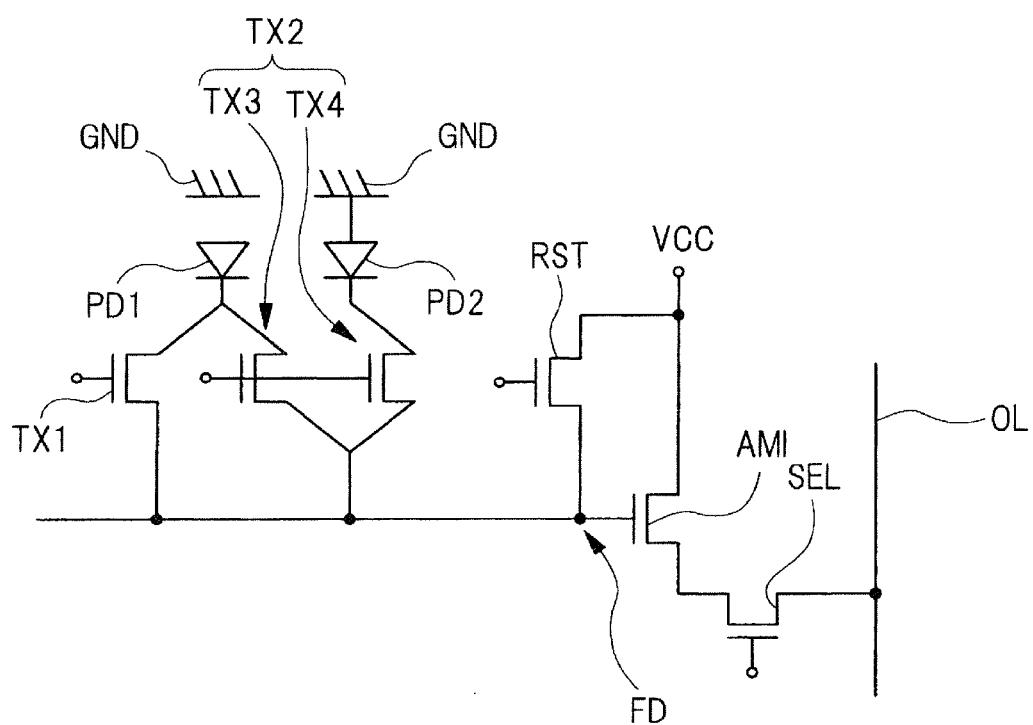
FIG. 2 is a circuit diagram illustrating the semiconductor device of the first embodiment of the invention.

FIG. 2 shows a circuit diagram of one pixel. Each of the pixels PE illustrated in FIG. 1 has a circuit illustrated in FIG. 2. As illustrated in FIG. 2, the pixel has photodiodes PD1 and PD2 that each perform photoelectric conversion, a transfer transistor TX1 that transfers charge generated in the photodiode PD1, and a transfer transistor TX2 that transfers charge generated in each of the photodiodes PD1 and PD2. The pixel further has a floating diffusion capacitance section FD that stores charge transferred from the transfer transistors TX1 and TX2, and an amplifier transistor AMI that amplifies an electric potential of the floating diffusion capacitance section FD. The pixel further includes a selection transistor SEL that selects whether or not the potential amplified by the amplifier transistor AMI is output to the output line OL coupled to one of the read circuits CC1 and CC2 (see FIG. 1), and a reset transistor RST that initializes potentials of the cathodes of the photodiodes PD1 and PD2 and a potential of the floating diffusion capacitance section FD into a predetermined potential. The transfer transistors TX1 and TX2, the reset transistor RST, the amplifier transistor AMI, and the selection transistor SEL are each an N MOS transistor, for example.

The anode of each of the photodiodes PD1 and PD2 is to receive ground potential GND as a negative-side power potential. The cathode of the photodiode PD2 is coupled to the source of the transfer transistor TX2. The cathode of the photodiode PD1 is coupled to each of the sources of the transfer transistors TX1 and TX2. The floating diffusion capacitance section FD is coupled to each of the drains of the transfer transistors TX1 and TX2, the source of the reset transistor RST, and the gate of the amplifier transistor AMI.

The drain of the reset transistor RST and the drain of the amplifier transistor AMI are each to receive the positive-side power potential VCC. The source of the amplifier transistor AMI is coupled to the drain of the selection transistor SEL. The source of the selection transistor SEL is coupled to the output line OL coupled to one of the read circuits CC1 and CC2.

The transfer transistor TX2 includes a transfer transistor TX3 having a source region including the photodiode PD1 and a drain region including the floating diffusion capacitance section FD, and a transfer transistor TX4 having a source region including the photodiode PD2 and a drain region including the floating diffusion capacitance section FD. In other words, the transfer transistors TX3 and TX4 share their gate electrodes and drain regions.

In other words, the photodiode PD2 is coupled to the floating diffusion capacitance section FD via the transfer transistor TX2, specifically the transfer transistor TX4. On the other hand, the photodiode PD1 is coupled to the floating diffusion capacitance section FD via the transfer transistor TX1 and via the transfer transistor TX2, specifically the transfer transistor TX3. In other words, the transfer transistors TX1 and TX2 are coupled in parallel between the photodiode PD1 and the floating diffusion capacitance section FD.

The gate electrodes of the transfer transistors TX3 and TX4 are electrically coupled to each other. Hence, when a predetermined voltage is applied to the gate electrode of the transfer transistor TX2 to energize the gate electrode, both the transfer transistors TX3 and TX4 are turned on. Consequently, when the transfer transistor TX2 is turned on, charge generated in the photodiode PD1 and charge generated in the photodiode PD2 are combined, and the combined charge is transferred to the floating diffusion capacitance section FD. Specifically, the transfer transistor TX2 is an element that combines, i.e., adds, the charge generated in the photodiode PD1 and the charge generated in the photodiode PD2, and transfers the combined charge to the floating diffusion capacitance section FD.

The charge in the photodiode PD2 cannot be transferred to the floating diffusion capacitance section FD if the transfer transistor TX2 is not turned on. On the other hand, the charge in the photodiode PD1 can be transferred to the floating diffusion capacitance section FD if one of the transfer transistors TX1 and TX2 is turned on. Hence, both the charge in the photodiode PD1 and the charge in the photodiode PD2 can be read by turning on only the transfer transistor TX2. Consequently, the charge in each of the photodiodes PD1 and PD2 is initialized, i.e., reset.

Figure 3:
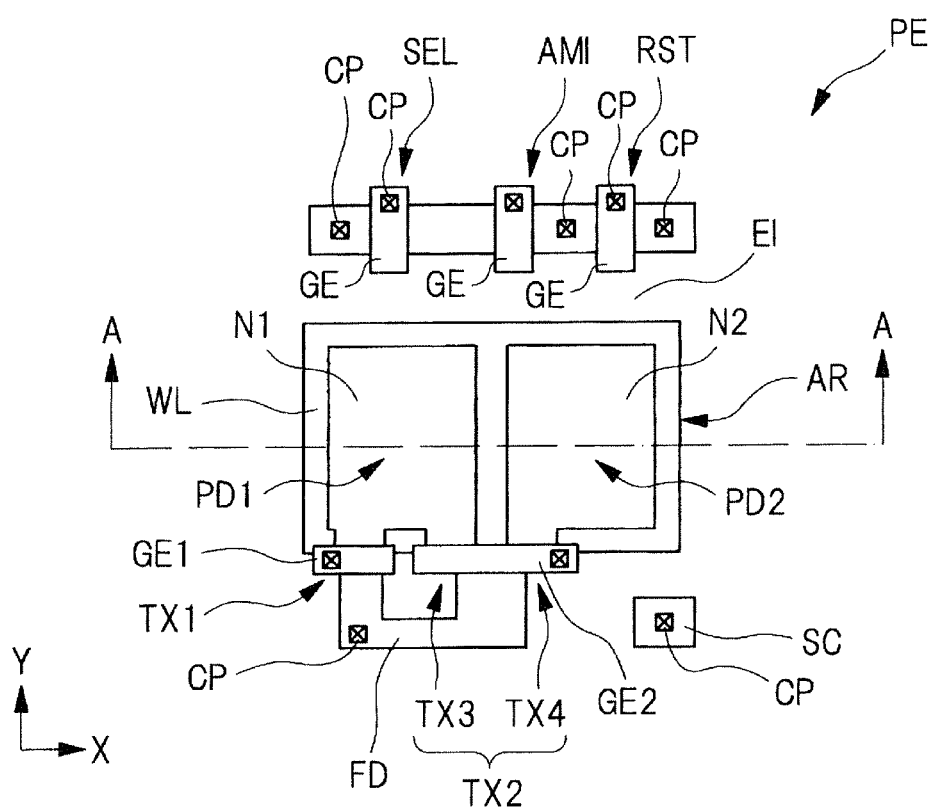
FIG. 3 shows a planar layout illustrating the semiconductor device of the first embodiment of the invention.
Figure 4:
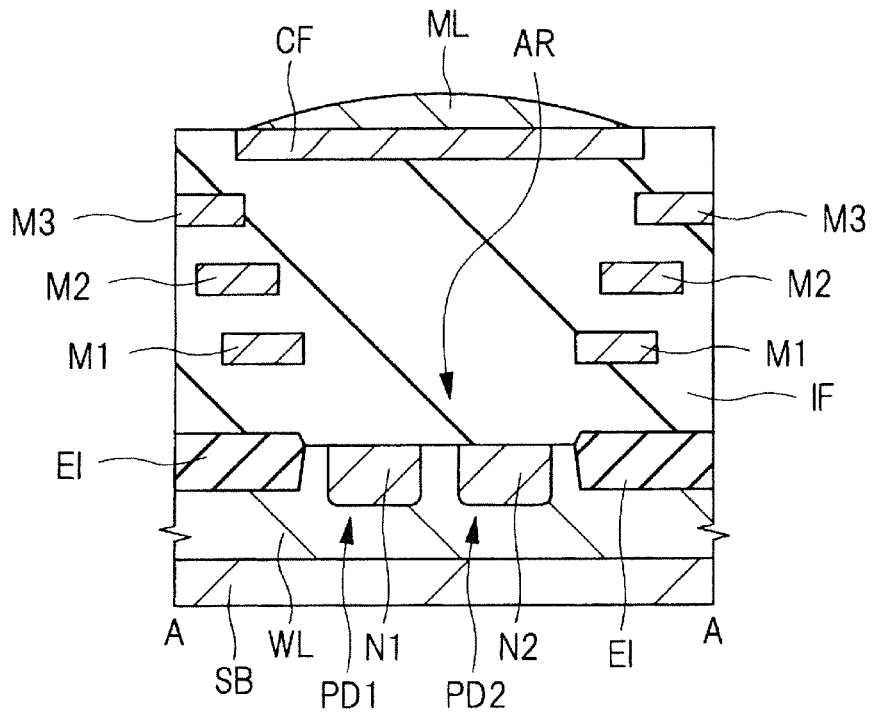
FIG. 4 is a sectional diagram along a line A-A in FIG. 3.

FIG. 3 shows a planar layout of the pixel PE. FIG. 4 shows a sectional diagram along a line A-A in FIG. 3. FIG. 3 shows, in an enlarged manner, a planar layout illustrating one pixel PE of the pixel allay section PEA illustrated in FIG. 1. FIG. 3 shows the photodiodes and their peripheral components such as transistors while omitting other components provided thereon, such as interlayer insulating films, interconnections, and a microlens.

As illustrated in FIG. 3, most area of the pixel PE is occupied by a light receiving section having the photodiodes PD1 and PD2 therein. A plurality of peripheral transistors and a substrate contact section SC are arranged around the light receiving section. An element isolating region EI surrounds each of the peripheries of the active regions of the light receiving section, the peripheral transistors, and the substrate contact section SC. The peripheral transistors described herein refer to the reset transistor RST, the amplifier transistor AMI, and the selection transistor SEL.

The active region AR of the light receiving section has a shape close to a rectangle in a plan view. In the active region AR, the photodiodes PD1 and PD2 are arranged side by side in the X-axis direction. The photodiodes PD1 and PD2 are provided separately from each other, and each have a rectangular shape in a plan view.

The peripheral transistors are provided in the same active region that extends in the X-axis direction along a first side of the active region AR of the light receiving section. There are provided the transfer transistor TX1 having a source region including the photodiode PD1 in the active region AR and the transfer transistor TX2 having a source region including the photodiode PD2 in the active region AR along a second side of the active region AR as a side farer from the peripheral transistors.

The peripheral transistors each have a gate electrode GE extending in the Y-axis direction. The transfer transistor TX1 has a gate electrode GE1 extending in the X-axis direction. The transfer transistor TX2 has a gate electrode GE2 extending in the X-axis direction. The gate electrodes GE, GE1, and GE2 are composed of, for example, polysilicon, and provided over the semiconductor substrate with an undepicted gate insulating film in between. The gate electrodes GE1 and GE2 are separated from each other. While the gate electrode GE1 neighbors one side of the photodiode PD1 having a rectangular plan layout, the gate electrode GE2 extends from the one side of the photodiode PD1 to one side of the photodiode PD2 having a rectangular plan layout while neighboring such sides.

The transfer transistor TX2 probably includes the transfer transistor TX3 having the source region including the photodiode PD1, and the transfer transistor TX4 having the source region including the photodiode PD2. Since the transfer transistors TX3 and TX4 share one gate electrode GE2, they are turned on together by energizing the gate electrode GE2. When the transfer transistor TX2 is turned on, the transfer transistor TX3 transfers charge L1 generated in the photodiode PD1 to the floating diffusion capacitance section FD, and the transfer transistor TX4 transfers charge R1 generated in the photodiode PD2 to the floating diffusion capacitance section FD.

The floating diffusion capacitance section FD is a semiconductor region that serves as the drain region of each of the transfer transistors TX1, TX2, TX3, and TX4, and is provided in the active region AR. The floating diffusion capacitance section FD is electrically floating; hence, when the reset transistor RST is not activated, the floating diffusion capacitance section FD retains the charge accumulated therein.

In the active region having the peripheral transistors therein, the reset transistor RST, the amplifier transistor AMI, and the selection transistor SEL are arranged in this order in the X-axis direction. The reset transistor RST and the amplifier transistor AMI share the respective drain regions. The source region of the reset transistor RST is coupled to the drain region of each of the transfer transistors TX1 and TX2, i.e., coupled to the floating diffusion capacitance section FD. The source region of the amplifier transistor AMI functions as the drain region of the selection transistor SEL. The source region of the selection transistor SEL is coupled to the output line OL as described with reference to FIG. 2.

The drain region of each of the transfer transistors TX1 and TX2, the source region of the selection transistor SEL, the source region of the reset transistor RST, and the drain region of the amplifier transistor AMI are each an $N^+$ semiconductor region provided on the main surface of the semiconductor substrate, and the substrate contact section SC is a $P^+$ semiconductor region provided on the main surface of the semiconductor substrate. A contact plug CP is coupled to each of the tops of the semiconductor regions. A contact plug CP is also coupled to each of the tops of the gate electrodes GE, GE1, and GE2.

The substrate contact section SC is a semiconductor region that receives the ground potential GND (see FIG. 2), and prevents fluctuations in the threshold voltage of each peripheral transistor by fixing the potential of a well in the top portion of the semiconductor substrate to 0 V.

The photodiode PD1 (first light receiving element) and the photodiode PD2 (second light receiving element), which are arranged in the X-axis direction in the active region AR as the light receiving section, are each a semiconductor element extending in the Y-axis direction. Specifically, each of the photodiodes PD1 and PD2 has a longitudinal direction along the Y-axis direction.

As described later, the photodiode PD1 is composed of an $N^-$ semiconductor region N1 and a well region WL as a P semiconductor region provided on the main surface of the semiconductor substrate. Similarly, the photodiode PD2 is composed of an $N^-$ semiconductor region N2 and the well region WL provided on the main surface of the semiconductor substrate. The photodiodes PD1 and PD2 as the light receiving elements illustrated in FIG. 3 are probably provided in the formation regions for the $N^-$ semiconductor regions N1 and N2, respectively. In the active region AR, the $P^-$ well region WL is provided around each of the regions having the $N^-$ semiconductor regions N1 and N2.

The active region AR has a shape close to a rectangle in a plan view. One of the four sides of the rectangle has two protrusions coupled to each other at their extending ends. Specifically, the active region AR has a ring-like plan layout including such protrusions and the rectangular pattern of the light receiving section. The element isolating region EI is provided inside the ring-like plan layout. The respective protrusions have the drain regions of the transfer transistors TX1 and TX2. Specifically, the transfer transistors TX1 and TX2 share the floating diffusion capacitance section FD as the drain region of each transfer transistor. The respective gate electrodes GE1 and GE2 are arranged across the two protrusions.

When a captured image is output, the signals (charge) from the two photodiodes in the pixel are combined and output in a form of a signal. This makes it possible to produce an image with image quality similar to that of an image by a solid-state imaging device including a plurality of pixels each having one photodiode.

FIG. 4 shows a sectional diagram along a direction in which the photodiodes PD1 and PD2 are arranged in one pixel PE (see FIG. 3). The sectional diagram of FIG. 4 omits the boundaries between interlayer insulating films stacked on the semiconductor substrate SB. As illustrated in FIG. 4, the $P^-$ well region WL is provided in the top portion of the semiconductor substrate SB including N single crystal silicon. The element isolating regions EI are provided on the well region WL so as to divide the active region AR from other active regions. The element isolating region EI is composed of, for example, a silicon oxide film, and is embedded in a trench provided over the top of the semiconductor substrate SB.

The $N^-$ semiconductor regions N1 and N2 are separately provided in the top portion of the well region WL. A portion of the well-region WL forming a PN junction with the $N^-$ semiconductor region N1 functions as an anode of the photodiode PD1. A portion of the well region WL forming a PN junction with the $N^-$ semiconductor region N2 functions as an anode of the photodiode PD2. The $N^-$ semiconductor regions N1 and N2 are provided in the active region AR across which the element isolating regions EI are located.

In this way, the active region AR provided in the pixel has therein the photodiode PD1 including the $N^-$ semiconductor region N1 and the well region WL and the photodiode PD2 including the $N^-$ semiconductor region N2 and the well region WL. In the active region AR, the photodiodes PD1 and PD2 are arranged side by side across a region in which the well region WL is exposed on the top of the semiconductor substrate SB.

Each of the $N^-$ semiconductor regions N1 and N2 has a depth smaller than the depth of the well region WL. The trench filled with the element isolating region EI over the top of the semiconductor substrate SB has a depth smaller than the depth of each of the N⁻ semiconductor regions N1 and N2.

An interlayer insulating film IF is provided over the semiconductor substrate SB while covering the element isolating region EI and the photodiodes PD1 and PD2. The interlayer insulating film IF is a stacked film including a plurality of insulating films. A plurality of interconnection layers are stacked in the interlayer insulating film IF, and an interconnection M1 covered with the interlayer insulating film IF is provided in the bottom interconnection layer. An interconnection M2 is provided above the interconnection M1 with the interlayer insulating film IF in between, and an interconnection M3 is provided above the interconnection M2 with the interlayer insulating film IF in between. A color filter CF is provided in a top portion of the interlayer insulating film IF, and a microlens ML is provided on the color filter CF. During operation of the solid-state imaging device, light is applied to the photodiodes PD1 and PD2 through the microlens ML and the color filter CF.

No interconnection is provided directly above the active region AR having the photodiodes PD1 and PD2 therein. Consequently, light entering through the microlens ML is not shaded by the interconnection, and securely applied to the photodiodes PD1 and PD2 as a light receiving section of the pixel. On the other hand, the interconnections M1 to M3 are arranged in regions other than the active region AR, which prevents photoelectric conversion from occurring in the active region having the components such as the peripheral transistors.

Operation of the solid-state imaging device as the semiconductor device of the first embodiment is now described mainly with reference to FIG. 2. The operation of the solid-state imaging device includes imaging operation and autofocus operation.

Pixel operation for imaging is now described. First, a predetermined potential is applied to the gate electrode of each of the transfer transistor TX2 and the reset transistor RST to turn on both the transistors. This allows charge remaining in each of the photodiodes PD1 and PD2 and charge accumulated in the floating diffusion capacitance section FD to flow toward the positive-side power potential VCC, so that charge in each of the photodiodes PD1 and PD2 and charge in the floating diffusion capacitance section FD are initialized. Subsequently, the reset transistor RST is turned off.

Subsequently, incident light is applied to the PN junction of each of the photodiodes PD1 and PD2, causing photoelectric conversion in each diode. As a result, the charge L1 is generated in the photodiode PD1, and the charge L2 is generated in the photodiode PD2. In this way, the photodiodes PD1 and PD2 are each a light receiving element that generates therein a signal charge corresponding to light quantity of incident light through photoelectric conversion, i.e., photoelectric conversion element.

Subsequently, such charge is transferred to the floating diffusion capacitance section FD. In the imaging operation, the two photodiodes PD1 and PD2 in the pixel PE operate so as to function as a photoelectric conversion section; hence, the charge in the photodiode PD1 and charge in the photodiode PD2 are combined and read as a signal. In other words, in the imaging operation, charge signals generated by the two photodiodes PD1 and PD2 are added and acquired as one pixel data.

Hence, it is not necessary to individually read the charge in each of the photodiodes PD1 and PD2. Specifically, the transfer transistor TX2 is turned on while the transfer transistor TX1 is kept off, thereby the charge is transferred to the floating diffusion capacitance section FD. Consequently, the floating diffusion capacitance section FD accumulates the charge transferred from the photodiodes PD1 and PD2. This results in a variation in potential of the floating diffusion capacitance section FD.

The process of the charge combination is now specifically described. First, while the photodiode PD1 stores the charge L1 and the photodiode PD2 stores the charge R1, a voltage is applied to the gate electrode GE2 to turn on the transfer transistor TX2. Consequently, the charge L1 and the charge R1 are combined in a channel induced in the main surface of the semiconductor substrate directly below the gate electrode GE2. Subsequently, the combined charge L1+R1 is transferred to the floating diffusion capacitance section FD.

Subsequently, the selection transistor SEL is turned on, and the varied potential of the floating diffusion capacitance section FD is amplified by the amplifier transistor AMI, thereby an electric signal corresponding to the variation in potential of the floating diffusion capacitance section FD is output to the output line OL. In other words, the selection transistor SEL is activated, thereby an electric signal output by the amplifier transistor AMI is externally output. One of the read circuits CC1 and CC2 (see FIG. 1) reads such a potential of the output line OL.

Description is now made on pixel operation during image-plane phase difference autofocus. The solid-state imaging device as the semiconductor device of the first embodiment includes pixels each having a plurality of photoelectric conversion sections (for example, photodiodes). In this way, the pixel has the plurality of photodiodes therein. This is because when such a solid-state imaging device is used for, for example, a digital camera having an image-plane phase-difference autofocus detection system, faster and more accurate autofocus is enabled.

Such a digital camera calculates a moving distance of a lens necessary for focusing based on a shift level between a signal detected by one photodiode in a pixel and a signal detected by the other photodiode, i.e., based on a phase difference, and thus enables rapid focusing. A plurality of photodiodes provided in the pixel leads to a larger number of small photodiodes in the solid-state imaging device, which therefore allows more accurate autofocus. Hence, when autofocus is performed, unlike the imaging operation, the charge generated in each of the photodiodes in the pixel must be individually read.

In the autofocus detection operation, first, a predetermined potential is applied to the gate electrode of each of the transfer transistor TX2 and the reset transistor RST, so that both the transistors are turned on. This results in initialization of charge in each of the photodiodes PD1 and PD2 and charge in the floating diffusion capacitance section FD. Subsequently, the reset transistor RST is turned off.

Subsequently, incident light is applied to the PN junction of each of the photodiodes PD1 and PD2, causing photoelectric conversion in each diode. As a result, charge is generated in each of the photodiodes PD1 and PD2. It is assumed that the photodiode PD1 generates charge L1, and the photodiode PD2 generates charge R1.

Subsequently, one of the charge L1 and charge R1 is transferred to the floating diffusion capacitance section FD. The transfer transistor TX1 is first turned on, thereby the charge L1 in the photodiode PD1 is transferred to the floating diffusion capacitance section FD, so that a potential of the floating diffusion capacitance section FD is varied. Subsequently, the selection transistor SEL is turned on, and the varied potential of the floating diffusion capacitance section FD is amplified by the amplifier transistor AMI, and then the amplified potential is output to the output line OL. In other words, an electric signal corresponding to the variation in potential of the floating diffusion capacitance section FD is amplified by the amplifier transistor AMI and then output. One of the read circuits CC1 and CC2 (see FIG. 1) reads the potential of the output line OL. The read charge L1, i.e., the signal L1, is stored in the memory circuit MC (see FIG. 1).

At this time, the floating diffusion capacitance section FD still retains the charge L1 generated in the photodiode PD1, and thus still retains the varied potential. In addition, the charge R1 in the photodiode PD2 is still not transferred.

Subsequently, the transfer transistor TX2 is turned on, thereby the charge R1 in the photodiode PD2 is transferred to the floating diffusion capacitance section FD, so that the potential of the floating diffusion capacitance section FD is further varied. When the transfer transistor TX2 is thus turned on, the charge in the photodiode PD1 and the charge in the photodiode PD2 can be combined and transferred. However, since the charge L1 in the photodiode PD1 has been already transferred, only the charge R1 in the photodiode PD2 is transferred to the floating diffusion capacitance section FD.

Consequently, the floating diffusion capacitance section FD accumulates the charge as a combination of the previously accumulated charge L1 from the photodiode PD1 and the subsequently transferred charge R1 from the photodiode PD2. In other words, the floating diffusion capacitance section FD accumulates the charge L1+R1 therein.

Subsequently, the selection transistor SEL is turned on, and the varied potential of the floating diffusion capacitance section FD is amplified by the amplifier transistor AMI, and then the amplified potential is output to the output line OL. One of the read circuits CC1 and CC2 (see FIG. 1) reads the potential of the output line OL. The following calculation is performed to calculate the charge R1 generated in the photodiode PD2 from the read charge L1+R1. Specifically, the value of the charge L1 stored in the memory circuit MC (see FIG. 1) is subtracted from the value of the charge L1+R1. Consequently, the charge R1 in the photodiode PD2 can be read. Such calculation is performed by, for example, the control circuit COC (see FIG. 1).

Subsequently, a moving distance of the lens necessary for focusing is calculated based on a shift level between the signals L1 and R1 detected by the photodiodes PD1 and PD2 in each pixel PE of the pixel allay section PEA (see FIG. 1), i.e., based on a phase difference, and thus autofocus detection is performed.

When the charge in the photodiode PD1 and the charge in the photodiode PD2 are in turn read as described above, the charge R1 in the photodiode PD2 may be read before the charge L1 in the photodiode PD1 is read.

In another operation during autofocus, the calculation of the charge R1 from the combined charge L1+R1 is probably omitted. Specifically, the transfer transistor TX1 is first turned on so that the charge L1 is read and stored, and then the reset transistor RST is turned on to reset the floating diffusion capacitance section FD. The transfer transistor TX2 is subsequently turned on, thereby the charge R1 in the photodiode PD2 can be singly read. In this case, although the charge L1 must also be stored in the memory circuit MC (see FIG. 1), the charge L1 and the charge R1 can be individually read without such calculation.

As described above, particularly the transfer transistors TX1 and TX2 each differently operate between the imaging operation and the autofocus operation. Although a step of turning on each of the transfer transistors TX1 and TX2 is necessary in the autofocus operation, only the transfer transistor TX2 should be turned on in the imaging operation.

When the solid-state imaging device of the first embodiment is used for a digital camera, the above-described imaging operation is performed for each pixel for both still imaging and video imaging. For video imaging, the autofocus operation is performed for each pixel during imaging. For still imaging, focus may be performed through the autofocus operation for each pixel, or performed with an external autofocus unit without the autofocus operation for each pixel.

Figure 7:
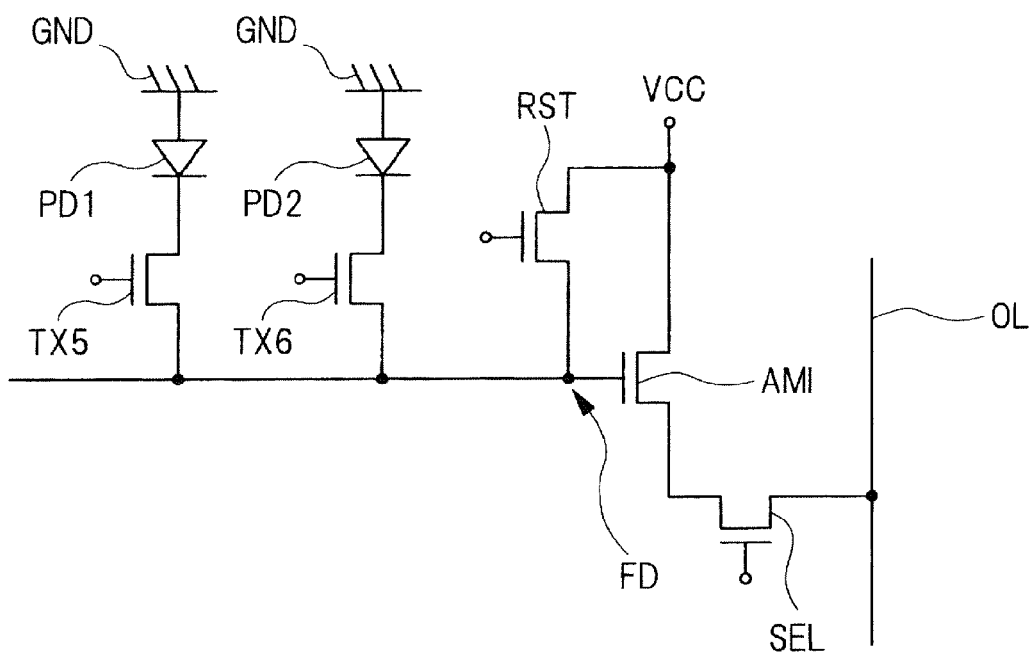
FIG. 7 is a circuit diagram illustrating a semiconductor device of a comparative example.
Figure 8:
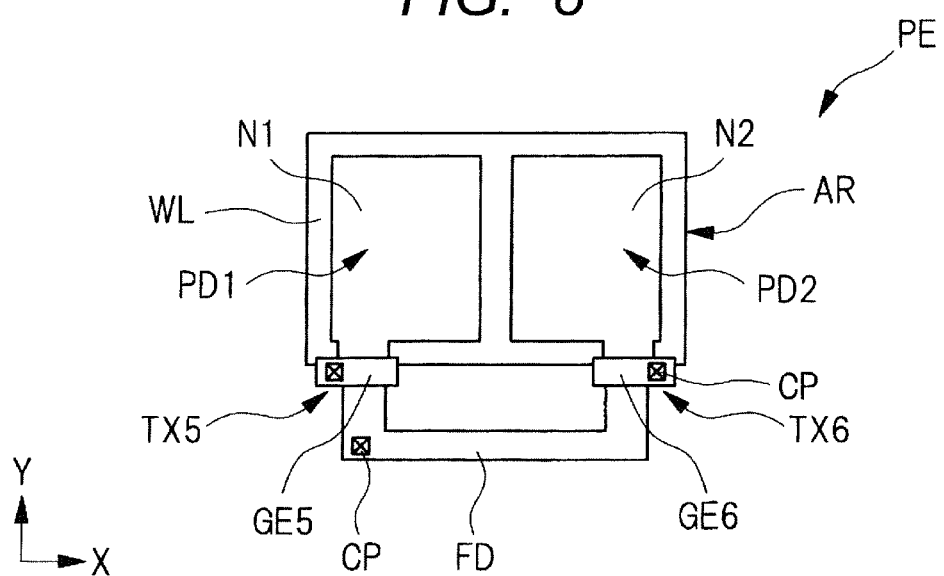
FIG. 8 shows a planar layout illustrating the semiconductor device of the comparative example.

Effects of the semiconductor device of the first embodiment are now described with a comparative example illustrated in FIGS. 7 and 8. FIG. 7 is a circuit diagram illustrating a pixel as a component of a semiconductor device of the comparative example. FIG. 8 shows a planar layout illustrating a pixel as a component of the semiconductor device of the comparative example. FIG. 8 illustrates only a light receiving section and two transfer transistors neighboring the light receiving section in the configuration of the pixel PE.

As illustrated in FIG. 8, the light receiving section of the pixel PE has a configuration similar to that of the pixel PE of the first embodiment described with reference to FIG. 3, the configuration including the active region AR having a near rectangular layout, the photodiodes PD1 and PD2 arranged in the active region AR, and transfer transistors TX5 and TX6 neighboring the photodiodes PD1 and PD2, respectively. Although the pixel PE illustrated in FIG. 3 has a transfer transistor TX2 with a source including the two photodiodes PD1 and PD2, the pixel PE of the comparative example illustrated in FIGS. 7 and 8 does not have such a transfer transistor. In the comparative example, only the transfer transistor TX5 is proximally provided for the photodiode PD1, and only the transfer transistor TX6 is proximally provided for the photodiode PD2.

As illustrated in FIG. 8, the transfer transistors TX5 and TX6 are provided in the ring-like active region AR, and the gate electrode GE5 is provided in a top portion of one of two protrusions protruded in a plan view from the rectangular portion of the active region AR, while the gate electrode GE6 is provided in a top portion of the other protrusion. The gate electrode GE5 is a component of the transfer transistor TX5, and the gate electrode GE6 is a component of the transfer transistor TX6. The gate electrodes GE5 and GE6 are separated from each other. The transfer transistors TX5 and TX6 do not share the respective gate electrodes GE5 and GE6. Consequently, turning on one of the gate electrodes GE5 and GE6 does not result in simultaneous transfer of the charge in the photodiode PD1 and the charge in the photodiode PD2.

As illustrated in FIG. 7, only the transfer transistor TX6 exists between the photodiode PD2 and the floating diffusion capacitance section FD. This is similar to the configuration shown in FIG. 2, in which only the transfer transistor TX2, i.e., only the transfer transistor TX4, exists between the photodiode PD2 and the floating diffusion capacitance section FD.

On the other hand, the configuration illustrated in FIG. 7 is different from the configuration shown in FIG. 2 in that only the transfer transistor TX5 is coupled between the photodiode PD1 and the floating diffusion capacitance section FD. In FIG. 2, the transfer transistor TX2, i.e., the transfer transistor TX3, and the transfer transistor TX1 are coupled in parallel between the photodiode PD1 and the floating diffusion capacitance section FD.

Specifically, the pixel PE in the comparative example has one transfer transistor, which has a source region including the photodiode, for each photodiode. Hence, when the transfer transistor TX5 is turned on, the charge L1 in the photodiode PD1 is transferred, but the charge R1 in the photodiode PD2 is not transferred. Similarly, when the transfer transistor TX6 is turned on, the charge R1 in the photodiode PD2 is transferred, but the charge L1 in the photodiode PD1 is not transferred. Hence, when the charge in the photodiode PD1 and the charge in the photodiode PD2 are transferred together, both the transfer transistors TX5 and TX6 must be turned on.

When the transfer transistor TX5 shown in FIG. 7 is assumed as a first transfer section, the transfer transistor TX1 having the same function as that of the first transfer section is probably provided in the circuit illustrated in FIG. 2. When the transfer transistor TX6 shown in FIG. 7 is assumed as a second transfer section, the transfer transistor TX4 having the same function as that of the second transfer section is probably provided in the circuit illustrated in FIG. 2. In this case, the configuration shown in FIG. 2 is different from the configuration shown in FIG. 7 in that the transfer transistor TX2 including the transfer transistor TX3 is provided as a third transfer section.

The imaging operation of the solid-state imaging device of the comparative example is now described with reference to FIG. 7. First, a predetermined potential is applied to each of the gate electrodes of the transfer transistors TX5 and TX6 and the reset transistor RST to turn on such transistors. This results in initialization of charge in the each of the photodiodes PD1 and PD2 and charge in the floating diffusion capacitance section FD. Subsequently, the reset transistor RST is turned off. In the configuration described with reference to FIG. 2, the two photodiodes PD1 and PD2 can be reset together by turning on only the transfer transistor TX2. In the configuration of FIG. 7, however, if the two transfer transistors TX5 and TX6 are not turned on together, the two photodiodes PD1 and PD2 cannot be reset together.

Subsequently, incident light is applied to the PN junction of each of the photodiodes PD1 and PD2, causing photoelectric conversion in each diode. As a result, charge L1 and charge R1 are generated in the photodiodes PD1 and PD2, respectively.

Subsequently, the charge L1 and the charge R1 are transferred to the floating diffusion capacitance section FD. At this time, the transfer transistors TX5 and TX6 are turned on together, thereby the charge L1 in the photodiode PD1 and the charge R1 in the photodiode PD2 are transferred together to the floating diffusion capacitance section FD, so that the potential of the floating diffusion capacitance section FD is varied. In the configuration described with reference to FIG. 2, the potentials of the two photodiodes PD1 and PD2 can be transferred together by turning on only the transfer transistor TX2. In the configuration of FIG. 7, however, if the two transfer transistors TX5 and TX6 are not turned on together, the potentials of the two photodiodes PD1 and PD2 cannot be transferred together.

Subsequently, the selection transistor SEL is turned on, and the varied potential of the floating diffusion capacitance section FD is amplified by the amplifier transistor AMI, and then the amplified potential is output to the output line OL. One of the read circuits CC1 and CC2 (see FIG. 1) reads the potential of the output line OL.

Pixel operation during image-plane phase difference autofocus is now described with reference to FIG. 7. First, a predetermined potential is applied to each of the gate electrodes of the transfer transistors TX5 and TX6 and the reset transistor RST to turn on such transistors. This results in initialization of charge in each of the photodiodes PD1 and PD2 and charge in the floating diffusion capacitance section FD. Subsequently, the reset transistor RST is turned off. The two transfer transistors TX5 and TX6 must also be turned on together in order to reset the two photodiodes PD1 and PD2 together.

Subsequently, incident light is applied to the PN junction of each of the photodiodes PD1 and PD2, causing photoelectric conversion in each diode. As a result, the charge L1 and the charge R1 are generated in the photodiodes PD1 and PD2, respectively.

Subsequently, one of the charge L1 and the charge R1 is transferred to the floating diffusion capacitance section FD. First, the transfer transistor TX5 is turned on, thereby the charge L1 in the photodiode PD1 is transferred to the floating diffusion capacitance section FD. Subsequently, the amplified potential is output to the output line OL with the selection transistor SEL and the amplifier transistor AMI. One of the read circuits CC1 and CC2 (see FIG. 1) reads the potential of the output line OL. The read charge L1, i.e., the signal L1, is stored in the memory circuit MC (see FIG. 1).

Subsequently, the transfer transistor TX6 is turned on, thereby the charge R1 in the photodiode PD2 is transferred to the floating diffusion capacitance section FD, so that the potential of the floating diffusion capacitance section FD is further varied. Consequently, the floating diffusion capacitance section FD accumulates the charge as a combination of the previously accumulated charge L1 from the photodiode PD1 and the subsequently transferred charge R1 from the photodiode PD2. In other words, the floating diffusion capacitance section FD accumulates the charge L1+R1 therein. Subsequently, the charge R1 is calculated by a subtraction similar to the calculation process described with reference to FIG. 2. Consequently, L1 in the photodiode PD1 and the charge R1 in the photodiode PD2 can be individually read.

Subsequently, a moving distance of the lens necessary for focusing is calculated based on a shift level between the signals L1 and R1 detected by the photodiodes PD1 and PD2 in each pixel PE of the pixel allay section PEA (see FIG. 1), i.e., based on a phase difference, and thus autofocus detection is performed.

As described above, the imaging operation and the autofocus operation of the comparative example are performed in such a manner that the two transfer transistors TX5 and TX6 must be turned on together in order to first reset and initialize the charge in each of the photodiodes PD1 and PD2. In the imaging operation of the comparative example, if the two transfer transistors TX5 and TX6 are not turned on together, the potentials of the two photodiodes PD1 and PD2 cannot be transferred together.

Hence, the solid-state imaging device of the comparative example performs the reset operation and the operation of transferring charge from the photodiode for imaging, in each of which a potential must be supplied to each of the two gate electrodes GE5 and GE6 to turn on the two transfer transistors TX5 and TX6 together. The two transfer transistors are thus activated together for reset and transfer, which increases power consumption for activating the solid-state imaging device. Power consumption must be decreased particularly for video imaging with continuous imaging operation. However, if a potential is supplied to each of the plurality of transfer transistors in the pixel as with the comparative example, power consumption disadvantageously increases.

An increase in capacitance of the floating diffusion capacitance section FD causes an increase in noise in a signal output from the pixel. Hence, capacitance of the floating diffusion capacitance section FD should be decreased from the viewpoint of noise reduction. The semiconductor device of the comparative example has a relatively large distance between the transfer transistors TX5 and TX6, resulting in relatively large area of the floating diffusion capacitance section FD. Hence, in the comparative example, the floating diffusion capacitance section FD has a relatively large capacitance, which disadvantageously increases noise in the pixel PE.

In contrast, the semiconductor device of the first embodiment illustrated in FIG. 2 performs the imaging operation and the autofocus operation, in each of which charge in each of the photodiodes PD1 and PD2 is reset and initialized by turning on the transfer transistor TX2 and the reset transistor RST without turning on the transfer transistor TX1.

In the imaging operation, the transfer transistor TX2 is turned on while the transfer transistor TX1 is kept off, thereby the charge L1 and the charge R1 of the photodiodes PD1 and PD2 can be transferred together and can be combined in the floating diffusion capacitance section FD. Such operations can be thus performed without activating all the transfer transistors in the pixel, which makes it possible to decrease power consumption for activating the semiconductor device. Consequently, performance of the semiconductor device can be improved.

As illustrated in FIG. 3, the transfer transistor TX2 extends from a side of the photodiode PD1 to a side of the photodiode PD2 in a plan view, enabling a relatively small distance between the transfer transistors TX1 and TX2. Hence, it is possible to decrease area in a plan view of the semiconductor region, which acts as a common drain region of the transfer transistors TX1 and TX2, compared with that in the comparative example. The floating diffusion capacitance section FD is a portion retaining the charge accumulated in that semiconductor region. Hence, it is possible to reduce capacity of charge accumulated in the floating diffusion capacitance section FD by reducing the area of the semiconductor region. This makes it possible to reduce noise in the pixel PE. Consequently, performance of the semiconductor device can be improved.

The first embodiment is described with the photodiode having the anode including the P well region, and the cathode including a diffusion layer as the N⁻ semiconductor region. However, similar effects can be unlimitedly exhibited in a solid-state imaging device having a photodiode including an N well and a P diffusion layer in the N well, or a photodiode including the N well and the P⁻ diffusion layer, on each of which a diffusion layer having the same conduction type as that of a pixel well is provided.

Second Embodiment

Figure 5:
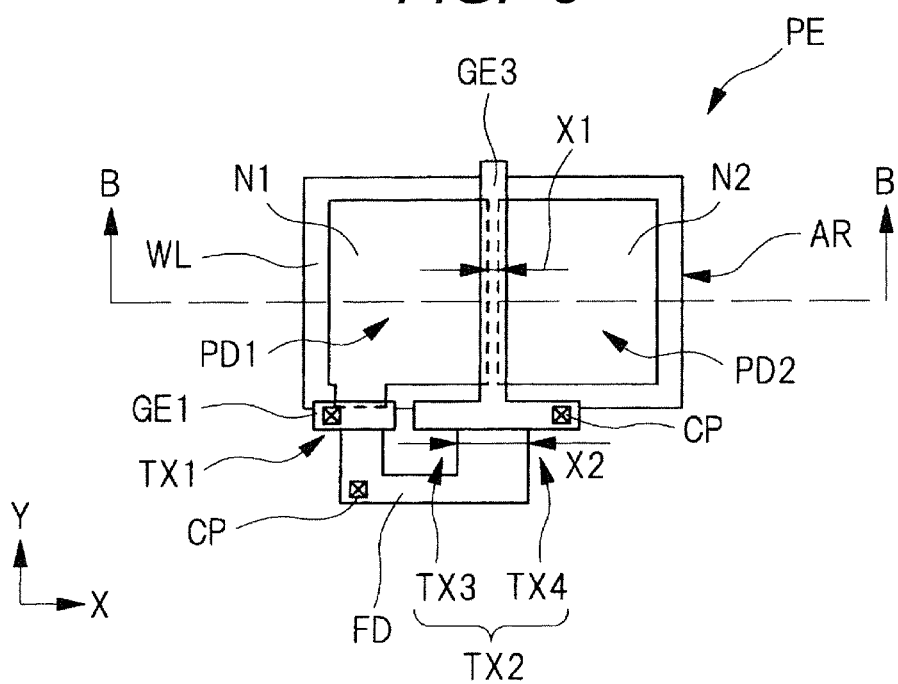
FIG. 5 shows a planar layout illustrating a semiconductor device of a second embodiment of the invention.
Figure 6:
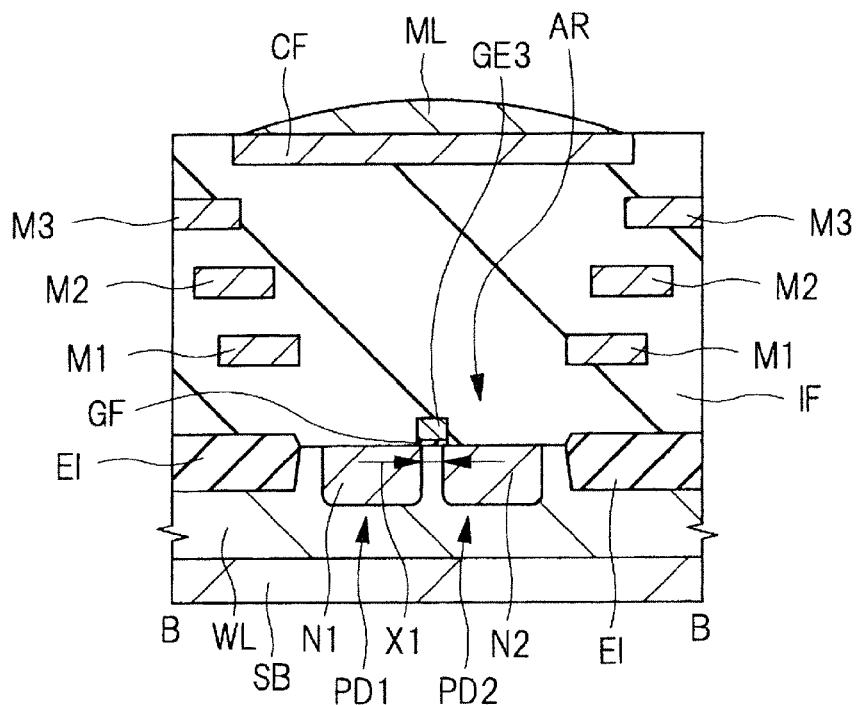
FIG. 6 is a sectional diagram along a line B-B in FIG. 5.

A second embodiment is described with reference to FIGS. 5 and 6 on a semiconductor device configured such that a gate electrode of a transfer transistor is provided between two photodiodes arranged in a pixel. FIG. 5 shows a planar layout illustrating the semiconductor device of the second embodiment. FIG. 6 is a sectional diagram along a line B-B in FIG. 5. FIG. 5 shows only a light receiving section and two transfer transistors neighboring the light receiving section in the configuration of the pixel PE.

The pixel PE of the second embodiment illustrated in FIG. 5 has a configuration substantially similar to that of the pixel PE of the first embodiment illustrated in FIG. 3. However, the pixel PE in FIG. 5 is different from that of the first embodiment in that part of the gate electrode GE3 as a component of the transfer transistor TX2 extends in the Y-axis direction between the photodiodes PD1 and PD2.

As illustrated in FIG. 5, the photodiodes PD1 and PD2 are arranged side by side in the X-axis direction in the active region AR of the pixel PE. The photodiodes PD1 and PD2 are provided separately across the well region WL, and part of the gate electrode GE3 is provided over the semiconductor substrate between the photodiodes PD1 and PD2 with an undepicted gate insulating film in between. In other words, the gate electrode GE3 is provided so as to separate the photodiodes PD1 and PD2 from each other in a plan view.

The gate electrode GE3 of the transfer transistor TX2 has a shape in a plan view as a combination of a first pattern extending in the X-axis direction, i.e., in a direction in which the photodiodes PD1 and PD2 are arranged, and a second pattern extending in the Y-axis direction, i.e., in a direction in which the photodiodes PD1 and PD2 extend, from the center in the X-axis direction of the first pattern. The first pattern extending in the X-axis direction of the gate electrode GE3 extends neighboring a side of each of the photodiodes PD1 and PD2 as with the gate electrode GE2 illustrated in FIG. 3. The second pattern extending in the Y-axis direction of the gate electrode GE3 is arranged between the photodiodes PD1 and PD2 in a plan view. In other words, the gate electrode GE3 has a T-shape in a plan view.

The N⁻ semiconductor region N1 for configuring the photodiode PD1 partially overlaps with the gate electrode GE3 in a plan view. Similarly, the N⁻ semiconductor region N2 for configuring the photodiode PD2 partially overlaps with the gate electrode GE3 in a plan view. FIG. 5 shows, by a broken line, a boundary between each of the N⁻ semiconductor regions N1 and N2 and the well region WL directly below the gate electrode GE3. FIG. 5 further shows, by a broken line, a contour of the photodiode PD1 in a region where the photodiode PD1 overlaps with the gate electrode GE in a plan view.

As illustrated in FIG. 6, the pixel PE has a sectional configuration, which is substantially similar to that of the first embodiment illustrated in FIG. 4, in a direction in which the photodiodes PD1 and PD2 are arranged. As illustrated in FIG. 6, however, the sectional configuration is different from that of the first embodiment in that the gate electrode GE3 is provided over the semiconductor substrate between the photodiodes PD1 and PD2 with a gate insulating film GF in between.

As illustrated in FIGS. 5 and 6, there is a distance X1 between the photodiodes PD1 and PD2 adjacent to each other in the pixel PE. As illustrated in FIG. 5, there is a width X2 of the drain region, which corresponds to part of the active region AR, of the transfer transistor TX2, which corresponds to a width in the X-axis direction of a semiconductor region for configuring the floating diffusion capacitance section FD near the gate electrode GE3.

The distance X1 is smaller than the distance (see FIG. 3) between the photodiodes PD1 and PD2 in the corresponding region in the first embodiment. This is because when an impurity ion is vertically implanted by ion implantation into the main surface of the semiconductor substrate in order to form the N⁻ semiconductor regions N1 and N2, the N⁻ semiconductor regions N1 and N2 are formed in a self-aligning manner with the gate electrode GE3 extending in the Y-axis direction as a mask.

Specifically, since the configuration illustrated in FIG. 3 has no gate electrode between the photodiodes PD1 and PD2, the opposed sides of the photodiodes PD1 and PD2 are formed at positions defined by ion implantation with a photoresist film as a mask. Since the photoresist film used as the ion implantation mask is less likely to be formed into a narrow pattern, a relatively large interval exists between the photodiodes PD1 and PD2.

On the other hand, the photoresist film used for patterning of the gate electrode GE3 illustrated in FIG. 5 is easily formed with a width that is smaller than that of the photoresist film used as the ion implantation mask. Hence, the gate electrode GE3 can be thinly formed with a width that is smaller than the width of the photoresist film used as the ion implantation mask. Consequently, the N⁻ semiconductor regions N1 and N2 are formed in a self-aligning manner with the gate electrode GE3 as a mask. This allows a small distance X1 between the photodiodes PD1 and PD2 opposed to each other in the pixel PE, and allows the photodiodes PD1 and PD2 to be formed with the distance X1 accurately maintained. Thus, decreasing the distance X1 allows area of the photodiodes PD1 and PD2 in the active region AR to be increased.

In general, when the area of the photodiodes PD1 and PD2 is small, and when the photodiodes PD1 and PD2 receive light during operation of the solid-state imaging device, the inside of each of the N⁻ semiconductor regions N1 and N2 is readily saturated with electrons; hence, blown-out-highlights may readily occur in an image formed by the pixels. In the second embodiment, however, since the area of the photodiodes PD1 and PD2 can be expanded as described above, the blown-out-highlights can be prevented. That is, the solid-state imaging device of the second embodiment can accumulate a larger number of electrons in the photodiodes PD1 and PD2.

Such a solid-state imaging device has relatively high sensitivity because it can respond to relatively bright light. Hence, a digital camera employing the solid-state imaging device is allowed to have a relatively wide dynamic range. Consequently, the second embodiment makes it possible to improve image quality of an image captured by the solid-state imaging device, resulting in improvement in performance of the semiconductor device.

Furthermore, the N⁻ semiconductor regions N1 and N2 for configuring the photodiodes PD1 and PD2 are formed in a self-aligning manner. This makes it possible to accurately form the N⁻ semiconductor regions N1 and N2 at desired positions regardless of exposure accuracy in lithography. This improves the yield and reliability of the semiconductor device.

For read operation during still imaging, the transfer transistor TX2 is activated, i.e., turned on. This results in lowering of a potential of a channel region below the gate electrode GE3 provided between the two photodiodes PD1 and PD2. Consequently, electrons accumulated in the photodiodes PD1 and PD2 are collected and combined in the low-potential channel region induced directly below the gate electrode GE3. Subsequently, the combined electrons are further conducted into the floating diffusion capacitance section FD having a further low potential.

In the second embodiment, the gate electrode GE3 extends along the full length of each of the opposed sides of the photodiodes PD1 and PD2. Consequently, each of the photodiodes PD1 and PD2 is in contact with the gate electrode GE3 along a wider span in a plan view than the solid-state imaging device of the first embodiment, which makes it possible to conduct charge to a wider gate. Hence, charge generated in each of the photodiodes PD1 and PD2 is readily conducted to a channel formed directly below the gate electrode GE3. This increases the width of the transfer section, and thereby charge transfer can be efficiently performed for imaging or autofocus detection. Consequently, charge read operation can be performed at high speed, leading to improvement in performance of the semiconductor device.

In the second embodiment, the distance X2 as a width of the drain region of the transfer transistor TX2 can be designed to be smaller than the width of the drain region of the corresponding transfer transistor TX2 (see FIG. 3) of the solid-state imaging device of the first embodiment. This is because the charge in each of the photodiodes PD1 and PD2 illustrated in FIG. 5 is allowed to be conducted to the channel region directly below the gate electrode GE3 extending in the Y-axis direction between the photodiodes, and then transferred to the floating diffusion capacitance section FD, and thereby the photodiodes PD1 and PD2 are each not necessary to overlap with the portion of the gate electrode GE3 extending in the X-axis direction.

Hence, even if there is a small distance X2, which is the width of the drain region of the transfer transistor TX2 neighboring the gate electrode GE3 portion extending in the X-axis direction, it is possible to prevent a reduction in transfer efficiency of charge from the photodiodes PD1 and PD2. The distance X2 can be thus reduced, making it possible to reduce area of the semiconductor region for configuring the floating diffusion capacitance section FD. Hence, capacitance of the floating diffusion capacitance section FD can be reduced, making it possible to reduce noise generated in the pixel PE. Consequently, performance of the semiconductor device can be improved.

Although the invention achieved by the inventors has been described in detail according to some embodiments thereof hereinbefore, the invention should not be limited thereto, and it will be appreciated that various modifications or alterations thereof may be made within the scope without departing from the gist of the invention.

For example, although the first and second embodiments have been described with a configuration where two photodiodes are provided in a pixel, the number of photodiodes provided in the pixel may be an even number larger than two. For example, when four photodiodes are provided in the pixel, assuming that two sets of light receiving sections, each set including two photodiodes, are provided, the two photodiodes in the light receiving section of each set are configured in the same way as those of the semiconductor device of the first or second embodiment.

Although the two protrusions from the rectangular portion of the active region AR are connected to each other to form one floating diffusion capacitance section FD in the first or second embodiment, one of the protrusions, which configures the drain of the transfer transistor TX1, may not be connected to the other protrusion that configures the drain of the transfer transistor TX2. In such a case, the protrusions are electrically coupled to each other with the contact plugs CP and interconnections, and the semiconductor region of each protrusion is used as the floating diffusion capacitance section FD.

What is claimed is:
1. A semiconductor device, comprising:
   a solid-state imaging device including a plurality of pixels, each of the plurality of pixels comprising:

a first light receiving element and a second light receiving element that each generate charge corresponding to light quantity of incident light, a first transfer transistor that transfers charge in the first light receiving element to a floating diffusion capacitance section, and a second transfer transistor that combines the charge in the first light receiving element and charge in the second light receiving element, and transfers the combined charge to the floating diffusion capacitance section.

2. The semiconductor device according to claim 1, wherein the first transfer transistor has a source including the first light receiving element and a drain including the floating diffusion capacitance section, and the second transfer transistor has a source including the first light receiving element and the second light receiving element and a drain including the floating diffusion capacitance section.

3. The semiconductor device according to claim 1, wherein in imaging operation using the solid-state imaging device, the charge in the first light receiving element and the charge in the second light receiving element are combined and acquired as one pixel data.

4. The semiconductor device according to claim 3, wherein in the imaging operation, the second transfer transistor is activated, thereby the charge in the first light receiving element and the charge in the second light receiving element are combined and read.

5. The semiconductor device according to claim 1, wherein the pixel further includes an amplifier transistor that outputs an electric signal corresponding to fluctuations in potential of the floating diffusion capacitance section, a reset transistor that resets the potential of the floating diffusion capacitance section to a predetermined value, and a selection transistor that externally outputs the electric signal output by the amplifier transistor, wherein the reset transistor and the second transfer transistor are activated, thereby the charge in the first light receiving element and the charge in the second light receiving element are each initialized.

6. The semiconductor device according to claim 1, wherein a first gate electrode as a component of the first transfer transistor is provided neighboring the first light receiving element, and a second gate electrode as a component of the second transfer transistor is provided neighboring both the first light receiving element and the second light receiving element.

7. The semiconductor device according to claim 1, wherein part of the second gate electrode as the component of the second transfer transistor is arranged between the first light receiving element and the second light receiving element in a plan view.

8. The semiconductor device according to claim 7, wherein the first transfer transistor and the second transfer transistor are arranged in a first direction, and the second gate electrode between the first light receiving element and the second light receiving element extends in a second direction perpendicular to the first direction.

9. The semiconductor device according to claim 1, wherein the second transfer transistor separately receives the charge in the first light receiving element and the charge in the second light receiving element, combines the separately received charge in the first light receiving element and charge in the second light receiving element, and transfers the combined charge to the floating diffusion capacitance section.

* * * * *